United States Patent
Katou et al.

(10) Patent No.: US 7,457,648 B2
(45) Date of Patent: Nov. 25, 2008

(54) SCREW CAP FOR ELECTRONIC APPARATUS

(75) Inventors: Kazunori Katou, Kawasaki (JP); Nariyasu Hayakawa, Hokkaido (JP)

(73) Assignee: Fujitsu Limited, Kawasaki (JP)

( * ) Notice: Subject to any disclaimer, the term of this patent is extended or adjusted under 35 U.S.C. 154(b) by 477 days.

(21) Appl. No.: 11/199,184

(22) Filed: Aug. 9, 2005

(65) Prior Publication Data

US 2006/0030214 A1     Feb. 9, 2006

Related U.S. Application Data

(63) Continuation of application No. PCT/JP03/01390, filed on Feb. 10, 2003.

(51) Int. Cl.
*H04M 1/00*     (2006.01)
(52) U.S. Cl. ............... 455/575.1; 455/348; 379/433.11
(58) Field of Classification Search ............. 455/575.1, 455/575.2, 575.3, 347, 348, 349, 550.1; 379/428.01, 379/433.11, 433.13
See application file for complete search history.

(56) References Cited

U.S. PATENT DOCUMENTS

| | | | | |
|---|---|---|---|---|
| 5,819,163 A | * | 10/1998 | Tsukamoto et al. | ...... 455/575.1 |
| 6,728,556 B1 | * | 4/2004 | Whitley | .................. 455/575.1 |
| 7,006,854 B2 | * | 2/2006 | Choi | ...................... 455/575.3 |

FOREIGN PATENT DOCUMENTS

| | | |
|---|---|---|
| JP | 55-173719 | 12/1980 |
| JP | 56-47909 | 4/1981 |
| JP | 5-47848 | 12/1993 |
| JP | 2000-16224 | 1/2000 |
| JP | 2000-300720 | 10/2000 |
| JP | 2001-24763 | 1/2001 |
| JP | 2001024763 | * 1/2001 |
| JP | 2001-292209 | 10/2001 |

* cited by examiner

*Primary Examiner*—Blane J Jackson
(74) *Attorney, Agent, or Firm*—Staas & Halsey LLP

(57) ABSTRACT

An electronic apparatus includes a housing made of a first material, a functional member that is provided in the housing, is made of a second material, and has a predetermined function; and a shield that is made of the first material and hides the functional member, wherein the shield has an invisible perforation part in the shield, the perforation part being to be perforated by an external member in removing the shield from the housing.

8 Claims, 9 Drawing Sheets

SCREW CAP FOR ELECTRONIC APPARATUS

This application is a continuation based on PCT International Application No. PCT/JP2003/001390, filed on Feb. 10, 2003, which is hereby incorporated by reference herein in its entirety as if fully set forth herein.

BACKGROUND OF THE INVENTION

The present invention relates generally to an electronic apparatus, and more particularly to a shield that hides a member, such as a screw, from the outside. The present invention is suitable, for example, for a screw cap that hides a screw used to fix a housing of a portable terminal, such as a cellular phone, a personal handy phone system ("PHS"), and another mobile communication terminal (which are generally referred to as a mobile wireless communication apparatus in this application), a personal digital assistant ("PDA"), and a laptop personal computer ("PC"). The present invention is broadly applicable to an electronic apparatus in addition to the portable terminals, and does not limit an object to be hidden by the shield to the screw.

Recent electronic apparatuses, such as a portable electronic terminal (e.g., a cellular phone and a PDA) are required to have a small, low-profile and lightweight body for portability convenience, as well as having an improved design (or ornamental appearance), economical efficiency, and maintainability to meet users' preferences.

For example, a housing or case of a cellular phone includes screwed front and rear cases. The case is typically made of resin, patterned and colored, while the screw is made of metal, which is a different material from the case, and has a metallic color. The screws when visible on the case is so conspicuous that a user may tend to disassemble and convert the housing, undesirably jeopardizing the safety of the cellular phone. Therefore, a screw cap conventionally hides the screw that fixes the case and its vicinity, which are collectively referred to as a "screw part" hereinafter.

Referring now to FIGS. 7A to 9, a description will be given of the conventional screw cap 10. Here, FIG. 7A is a side view of the screw cap 10, and FIGS. 7B and 7C are perspective views of the screw cap 10 viewed from different angles. FIG. 8 is a plane view with partially enlarged screw caps 10 that cover the screws (not shown) in a cellular phone 2. FIG. 9 is a perspective view for explaining a removal of the screw cap 10.

The conventional screw cap 10 has an approximately triangle shape and includes, as shown in FIG. 7, a chamfered, approximately triangle top 12, a bevel 14 at the edge, and a bottom 15. A notch 16 is formed at the center of the bevel 14. In assembly, a double-sided tape is adhered to the bottom 15 of the screw cap 10, and the screw caps 10 are then attached to screw parts 4, a pair of right and left dents, in the cellular phone 2 as shown in FIG. 8. The screw cap 10 covers the screw part 4 and does not expose the screw under the top 12. The top 12 is level with the case, and made of the same material and color as those of the case 6, maintaining the design or appearance continuity at the screw parts 4.

In disassembly of the case 6 by detaching the screws for maintenance, the screw caps 10 are removed from the case 6 so as to expose the screws. In removing the screw caps 10 from the case 6, a pointed tool 20 is inserted into the notch 16 in the screw cap 10, as shown in FIG. 9, and an upper force is applied via the tip of the tool 20 against the adhesion of the double-sided tape by leverage.

The screw cap itself is also known in the art unrelated to the art of the inventive electronic apparatus. See, for example, Japanese Patent Applications, Publication Nos. 2000-16224 (elements 32a and 32b in FIG. 1 and Paragraph Nos. 0024 and 0029), and 2000-300720 (screw caps 150 and 157 in FIGS. 1, 4 and 7).

Disadvantageously, in inserting the tool 20 into the notch 16 in the screw cap 10 and removing the screw cap 10 from the case, the edge of the case 6 opposing to the notch 16 may possibly get damaged. Since the notch 16 is provided at the boundary with the case 6, the tool 20 inserted into the notch 16 easily damages the edge of the case 6 opposing to the notch 16. The fulcrum of the leverage is the edge of the case 6 opposing to the notch 16, and the tool 20 inserted into the notch 16 and powered easily damages the edge of the case 6 opposing to the notch 16. In particular, the typical tool 20 often uses metal tweezers, which is stronger than the resin case 6, and easily damages the case 6. In removing the screw cap 10, the tool 20 is forced onto the bottom 15 of the screw cap 10, and the screw cap 10 gets damaged. Therefore, the screw cap 10 is replaced at the maintenance. However, if the case 6 gets damaged and needs a replacement, the cost would increase. The maintenance that does not damage the case 6 needs skills and a longer maintenance time period. Thus, the conventional screw cap 10 has the bad maintainability (or disassembly performance). In particular, as the screw cap 10 becomes smaller and thinner for a smaller and thinner housing, the operability lowers remarkably.

The instant inventors have reviewed arranging a perforation hole in the (top surface of the) screw cap 10 instead of arranging the notch 16 around the screw cap 10. This configuration can protect the edge of the case 6 from damages in inserting the tool 20 into the perforation hole and removing the screw cap 10 by leverage. However, the perforation hole in the screw cap 10 highlights the screw cap 10 and generally deteriorates both the appearance continuity and safety, due to a double hole effect of the perforation hole and the dent hole into which the screw cap 10 is inserted. The screw cap 10 is preferably quiet for both the appearance continuity and safety. In addition, the perforation hole in the top surface 10 exposes the screw through the hole, contrary to the objective of the provision of the screw cap 10.

Instead of the metal tweezers for the tool 20, it is also conceivable to use a resin material similar to that of the case 6 or a softer material so as to prevent damages of the case 6. This measure, however, is impracticable since the double-sided tape has a comparatively strong adhesion and easily breaks a tip of the resin member. On the other hand, if the adhesion of the double-sided tape is made weaker so that the screw cap 10 is easily removed, the screw cap 10 would be undesirably removed from the cellular phone 2 and may possibly be lost at the non-maintenance time, for example, when an impact is applied to the cellular phone 2.

In addition, like the screw caps 10A and 10B in FIG. 8, a pair of screw caps 10 are not formed in bilateral symmetry because they have notches 16A and 16B at different positions. Due to the manufacture of these two differently shaped screw caps 10A and 10B, the conventional screw cap has the bad manufacturing performance, and increases the manufacturing cost.

BRIEF SUMMARY OF THE INVENTION

Accordingly, it is an object of the present invention to provide a shield and an electronic apparatus having the same, which improves the economical efficiency of and maintainability of the electronic apparatus, in which the above disadvantages are eliminated.

An electronic apparatus according to one aspect of the present invention includes a housing made of a first material, a functional member that is provided in the housing, is made of a second material, and has a predetermined function, and a shield that is made of the first material and hides the functional member, wherein the shield has an invisible perforation part in the shield, the perforation part being to be perforated by an external member in removing the shield from the housing. According to this electronic apparatus, the shield hides the functional member, and is removed when a sharp tool pierces through the perforation part, like a lid of milk bottle. Since the perforation part is located inside the shield, the sharp tool does not damage the housing or require a replacement of the housing when the sharp tool perforates through the perforation part and removes the shield by leverage because the sharp tool uses the perimeter of the perforation part as a fulcrum instead of using the housing as a fulcrum. The easy removal of the shield improves the operability. The invisible perforation part maintains the appearance continuity of the housing.

An electronic apparatus according to another aspect of the present invention includes a housing made of a first material, a functional member that is provided in the housing, is made of a second material, and has a predetermined function, and a shield that is removably provided to the housing, is made of the first material and hides the functional member, wherein the shield has no hole used to remove the shield from the housing. According to this electronic apparatus, the shield has no hole for removal, such as a perforation hole and a notch, lessens the likelihood of the disassembly and conversion of the housing, improving the safety. A removal of the shield may use a perforation of a sharp tool and other methods, such as use of a double-sided tape and a press button. Anyway, the housing does not get damaged in removing the shield, and the removal of the shield does not damage the housing or require a replacement of the housing.

An electronic apparatus according to still another aspect of the present invention includes a housing made of a first material, a functional member that is provided in the housing, is made of a second material, and has a predetermined function, and a shield that is made of the first material and hides the functional member, wherein a fulcrum of a power applied in removing the shield from the housing is located inside the shield. This electronic apparatus arranges the fulcrum inside the shield, and definitely protects the housing from damages in comparison with the prior art that arranges the fulcrum at the boundary between the housing and the shield or outside the shield, such as on the housing.

The shield may have a sectionally concave shape at the perforation part, and is configured to be perforated at a concave of the perforation part. The shield may be made, for example, of resin, and a thickness of the perforation part is set, for example, to about 0.6 mm or smaller. A thin-walled structure of the perforation part facilitates the perforation by the sharp tool in removing the shield from the housing. The shield may have a symmetrical shape. Thereby, it is unnecessary to prepare plural types of shields in arranging the shields at left and right portions, improving the manufacturing performance and economical efficiency. The functional member is preferably located under the perforation part. For example, in removing the shield from the housing by piercing the sharp tool through the shield, the sharp tip is prevented from damaging the housing by inserting the sharp tool near the functional member, such as a screw.

The perforation part is preferably located at a center of the shield. For example, in removing the shield from the housing by piercing the sharp tool through the shield, the housing is protected from damages since the perforation part is not located at the boundary between the shield and the housing.

The electronic apparatus may be a mobile wireless communication apparatus, and the functional member is a screw used to fix the housing, wherein the electronic apparatus may further include a display that displays communication information, wherein the housing includes a first housing that has the display on a first surface, and a second housing that has an operating part used to input the communication information, wherein the first housing is connected rotatably to the second housing, and the shield is provided to the first housing on the first surface. The first housing as a movable part attracts the user's attention in comparison with the second housing as a fixed part. Such a foldable mobile wireless communication apparatus often utilizes screws for fixture. As discussed above, the mobile wireless communication apparatus covers a cellular phone, a personal handy phone system ("PHS"), and another mobile communication terminal.

The above shield constitutes another aspect of the present invention.

Other objects and further features of the present invention will become readily apparent from the following description of the embodiments with reference to accompanying drawings.

DETAILED DESCRIPTION OF THE INVENTION

Figure 1:
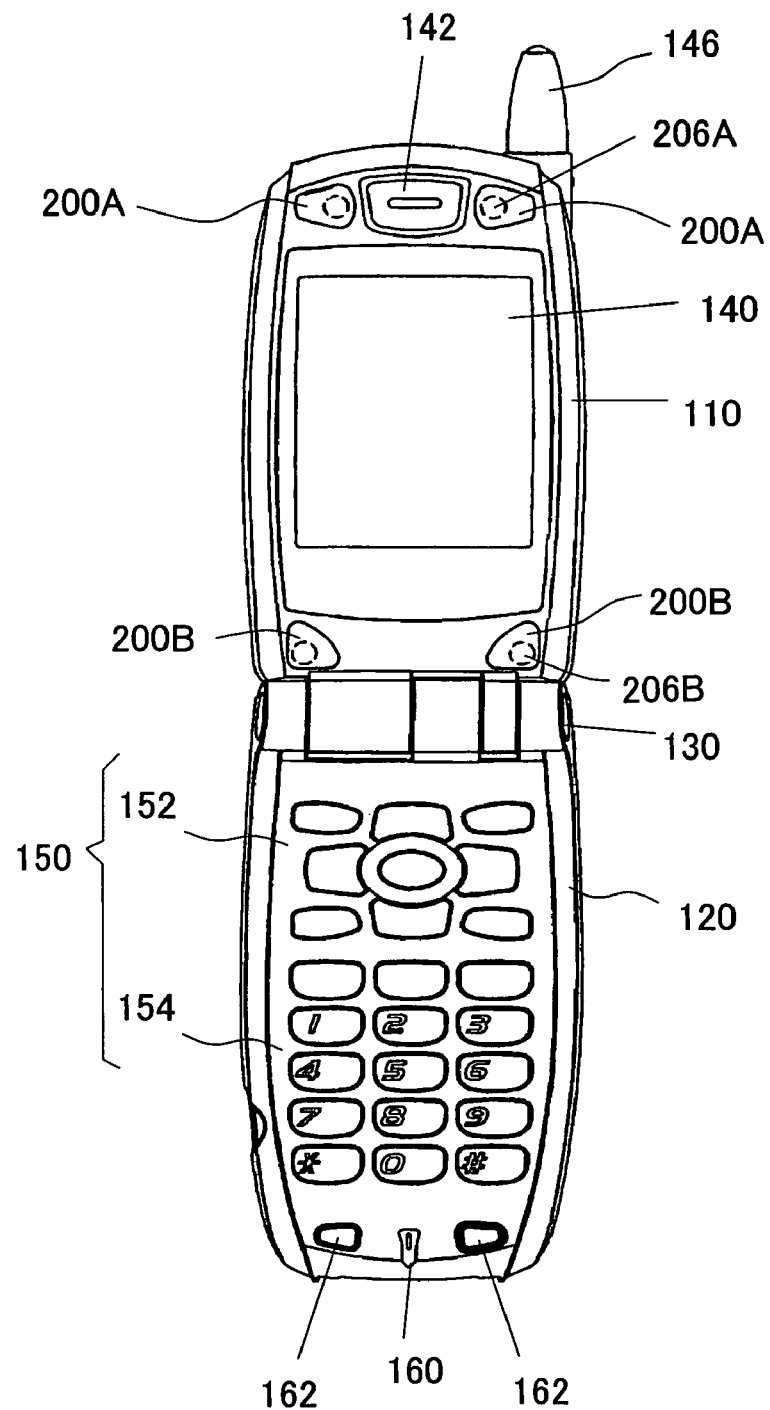
FIG. 1 is a front view of a cellular phone to which a screw cap according to one aspect of the present invention is attached.
Figure 2:
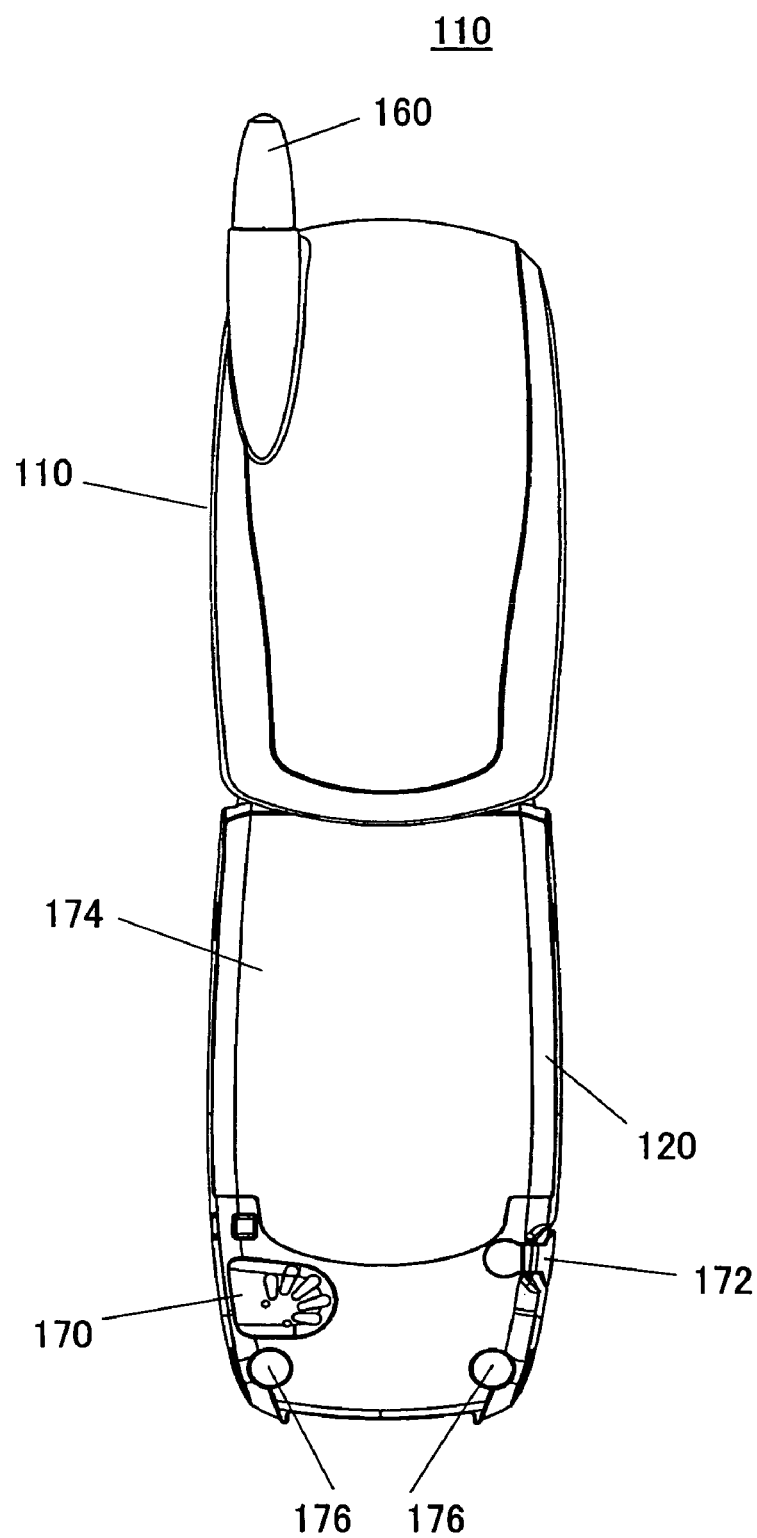
FIG. 2 is a rear view of the cellular phone shown in FIG. 1.
Figure 3:
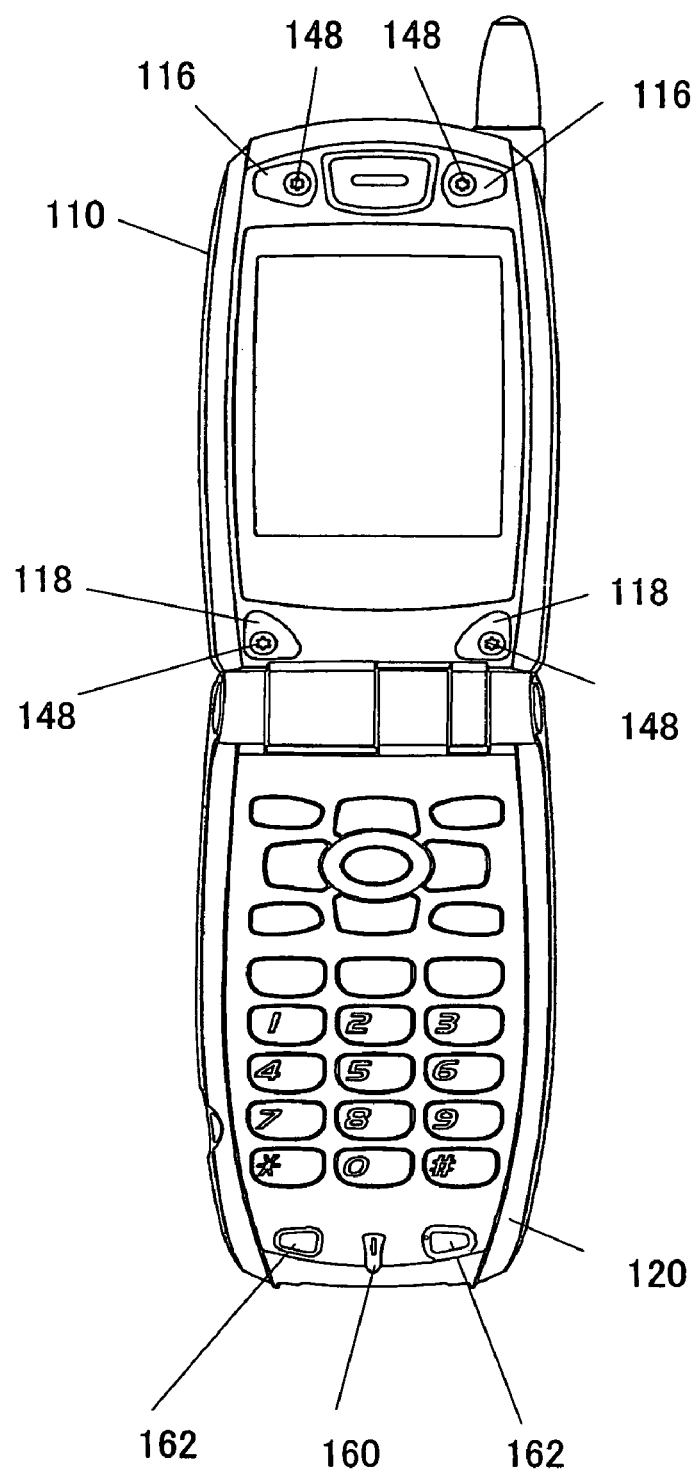
FIG. 3 is a front view of the cellular phone shown in FIG. 1 from which the screw cap is removed.
Figure 4:
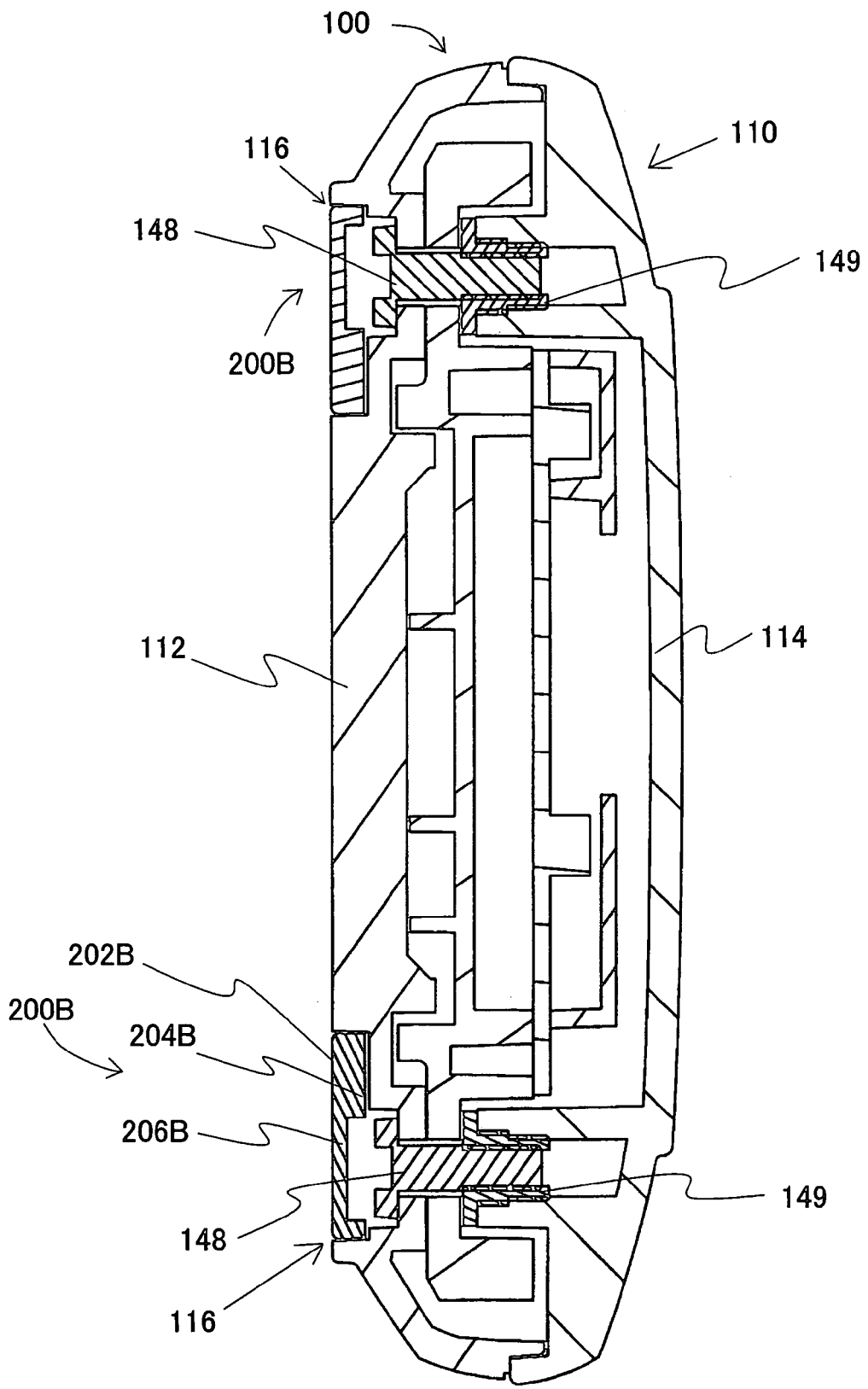
FIG. 4 is a schematic sectional view of the cellular phone shown in FIG. 1.

A description will now be given of a cellular phone 100 as one aspect of the present invention, with reference to the accompanying drawings. FIG. 1 is a front view of the cellular phone 100. FIG. 2 is a rear view of the cellular phone 100. FIG. 3 is a front view of the cellular phone 100 with a screw cap 200 detached. FIG. 4 is a schematic sectional view of the cellular phone 100.

While the cellular phone 100 is one illustrative electronic apparatus according to one aspect of the present invention, the present invention does not limit the electronic apparatus to the cellular phone. In addition, while the cellular phone 100 of this embodiment is a foldable cellular phone, the present invention does not limit the cellular phone to the foldable type.

The cellular phone 100 connects a movable part 110 to a fixed part with a hinge mechanism 130. As a result, the movable part 110 is rotatable around the fixed part 120. More specifically, a user can fold the movable part 110 onto the fixed part 120 by rotating the movable part 110 in a front direction in FIG. 1 during a non-use time of the cellular phone 100. In using the cellular phone 100, the movable part 110 can be unfolded from the fixed part 120 by rotating the folded movable part 110 in the back direction in FIG. 1.

The movable part 110 has a housing structure, as shown in FIG. 4, which combines a front case 112 with a rear case 114 through screws 148, and includes a display 140, a microphone 142, an antenna 146, and screws 148.

The movable part 110 is made, for example, of resin by injection molding. The display 140 is an LCD that displays communication information, such as outgoing information, incoming information, address book information, information input by an operating part 150, and other various types of information. The microphone 142 outputs communicatee's voices. The antenna 146 includes a helical antenna, and is used to communicate with a base station. These and other elements in the movable part 110, such as an internal antenna and an image pickup device, can apply any technologies known in the art, and a detailed description thereof will be omitted.

The screws 148 are inserted into screw holes formed in concaves 116 and 118 of the movable part 110, as shown in FIGS. 3 and 4, and engaged with a nut 149 provided in these screw hole. The screws 148 combine the front case 112 with the rear case 114. The screw 148 is made of metal, which is a different material from that of the movable part 110. Since the movable part 110 is patterned, colored and shaped in accordance with users' preferences, the screws 148 if exposing stand out, jeopardizing both the safety and the appearance continuity of the housing. Therefore, the screw caps 200A and 200B cover the concaves 116 and 118 as shown in FIG. 1, and hide the screws 148. Unless otherwise specified, the reference numeral 200 generalizes reference numerals 200A and 200B.

Referring to FIG. 3, when viewed from the top, a pair of teardrop shaped concaves 116 are arranged symmetrically, and a pair of approximately triangular concaves 118 are arranged symmetrically. The screws 148 inserted into the pair of concaves 116 fix the upper part of the movable part 110, and the screws inserted into the pair of concaves 118 fix the lower part of the movable part 110. The concaves 116 and 118 have a size of 1 mm.

Figure 5A:
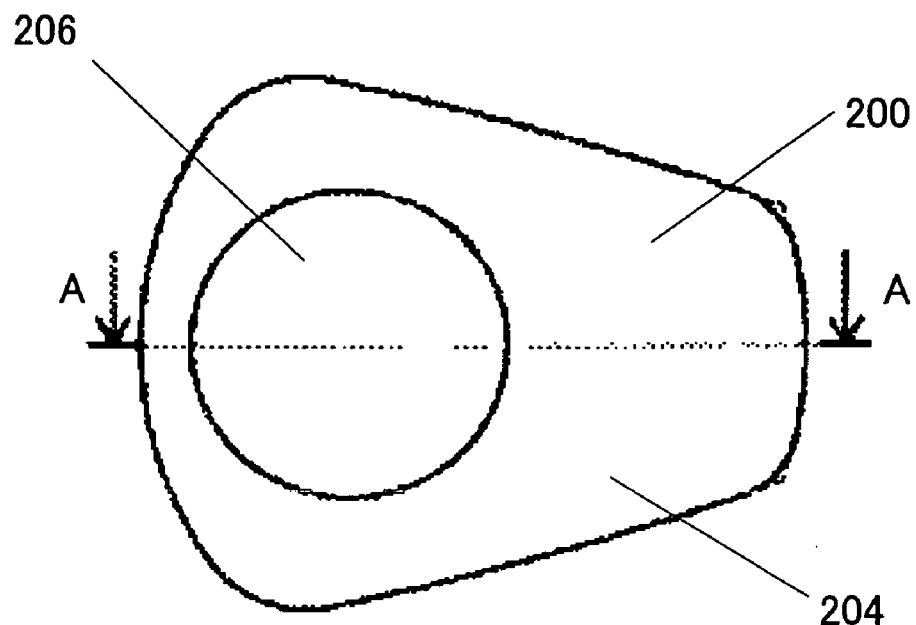
FIGS. 5A and 5B are sectional and rear views of the screw cap shown in FIG. 1.
Figure 5B:
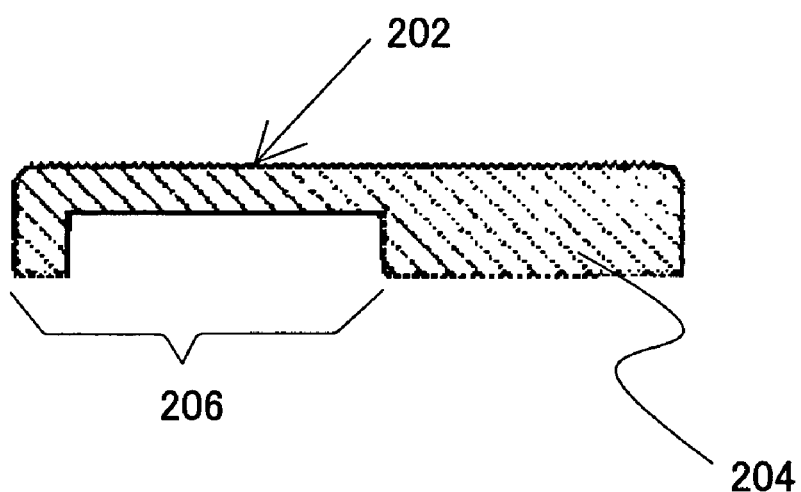

The screw cap 200 has, as shown in FIGS. 4, 5A and 5B, a base 204 and a thin-walled part 206. Here, FIG. 5A is a rear view of the screw cap 200, and FIG. 5B is a sectional view taken along a line A-A in FIG. 5A. Although the screw cap 200 shown in FIGS. 5A and 5B corresponds to the screw cap 200A inserted into the concave 116, the same discussion is applicable to the approximately triangle screw cap 200B inserted into the concave 118. Of course, the shape of the screw cap 200 is illustrative.

The screw cap 200 serves to hide the screw 148 below the screw cap 200. A veil of the screw maintains the appearance continuity of the housing without providing the user with the motives for unfastening of the screw and disassembly of the housing.

The screw cap 200 serves to maintain the appearance continuity of the housing above the concaves 116 and 118 as well as veiling the screw 148. Therefore, the screw cap 200 is made of the same material (such as resin in this embodiment), color, shape, and design as those of the housing (at the side of the display 148 of the movable part 110). Preferably, the screw cap 200 is fused with the housing so that it is inconspicuous and maintains the appearance continuity of the housing.

The screw cap 200 has a flat top surface 202 with no notch or perforation used for removal, such as the conventional notch 16. The flat surface is preferable to maintain the appearance continuity of the housing of the cellular phone 100. Of course, the top surface 200 may be shaped, patterned and colored in accordance with the shape of the cellular phone 100. Since the flat surface veils the thin-walled part 206, the user is unlikely to remove the screw cap 200 for disassembly and conversion.

The base 204 exemplarily has a uniform thickness of about 1 mm in this embodiment, and the thin-walled part 206 at almost the center of the base 204. A size of the base 204 is set in accordance with the necessary adhesion. As described later, the screw cap 200 is fixed onto the front case 110 via the double-sided tape 250, but the screw cap 200 is not generally fixed onto the front case 110 in a range of the thin-walled part 206. Therefore, if the base 204 is too small, the adhesion becomes too low to fix the screw cap 200 onto the housing, for example, when an impact is applied to the cellular phone 100, causing a loss of the screw cap 200. On the other hand, if the base 204 is too large, the adhesion becomes too strong to smoothly peel off the screw cap 200 with the tool 20, such as tweezers, causing a tear of the screw cap 200 during the peeling off or making the peeling difficult.

Of course, the present invention does not limit a removal of the screw cap 200 to the perforation using the tool 20. As long as the housing does not get damaged, any removing methods may be used. For example, a double-sided tape (not shown) may be adhered to the top surface 202 to lift up the screw cap 200 by using the adhesion between the top surface 202 and the double-sided tape. Alternatively, a press button mechanism that utilizes a compression spring may be used. The base 204 is adhered to the top of the press button so that one press fixes the screw cap 200 onto the housing and another press projects the screw cap 200 from the housing. A user can pinch and remove the projected screw cap 200 with a thumb and forefinger. The top surface 202 may have a projection and another shape so that the tweezers can lift the projection or the screw cap 200 may have a cork structure used for a wine bottle.

The thin-walled part 206 is a perforation part to be perforated in removing the screw cap 200 in this embodiment. However, as discussed above, the present invention does not limit the removal of the screw cap 200 to the perforation. The thin-walled part 206 serves to cover (the screw head of) the screw 148. This is because the tip of the tool 20 that pierces the screw cap 200 does not damage the housing when the screw 148 is located below the thin-walled part 206. The thin-walled part 206 has an illustratively circular shape when viewed from the bottom, and the circle has a diameter of about 5 mm in this embodiment. This diameter is set enough to cover (the screw head) of the screw 148.

The thin-walled part 206 in this embodiment has an illustratively uniform thickness of 0.6 mm or smaller, for example, about 0.5 mm, and forms a concave from the base 204 as shown in FIG. 5B. The thickness of 0.6 mm or smaller can facilitate the perforation by the tool 20. The thickness of the thin-walled part 206 is set thinner than the base 204 so that the tool 20 can easily pierces through the thin-walled part 20 in removing the screw cap 200. Alternatively, when a material is properly selected, the thin-walled part 206 is not necessary and may have the same thickness as that of the base 204.

The thin-walled part 206 is decentered to the left as shown in FIG. 5B in this embodiment so as to weaken the adhesion at the left side in FIG. 5B. In this embodiment, as shown in FIG. 6, which will be described later, the tool 20 is inserted into a portion that is decentered to the left side, and applies the force to peel off the base 204 at the right side as shown in FIG.

6. Therefore, if the adhesion at the left side is too strong, the left base 204 remains even after the right base 204 is peeled off. This requires a user to pinch the base 204 at the right side and to peel off the base 204 at the left side, lowering the operability. Nevertheless, even if the thin-walled part 206 is centered in FIG. 5B, the left adhesion can be weaker by lessening the amount of the double-sided tape 250 under the base 204 at the left side and weakening the left adhesion. Therefore, the decentering of the thin-walled part 206 is not vital for the present invention. While the thin-walled part 206 is invisible when viewed from the top surface 202 in this embodiment, the present invention does not preclude recognition of the thin-walled part 206 when the thin-walled part 206 is viewed from the top surface 202.

The screw cap 200 of this embodiment is made, for example, by injection molding. Unlike the conventional screw cap 10, the same screw cap 200 is applicable to a pair of concaves, such as the pair of concaves 116. The injection molding can use the same mold, and facilitates the manufacture of the screw cap 200. In addition, the screw cap 200 has no notch 16 or no perforation hole for removal unlike the prior art. A projection that forms the notch and perforation hole in the mold is unnecessary, and a production of the mold becomes easier. The screw cap 200 of this embodiment thus improves the manufacturing performance and reduces the manufacture cost.

In attaching the screw cap 200, a double-sided tape that has a shape corresponding to the (teardrop or triangular) concaves 116 and 118 shown in FIG. 3 is adhered to the back surface of the screw cap 200, and then the screw cap 200 is adhered to the concaves 116 and 118. Of course, the screw cap 200 may be adhered after the double-sided tape is adhered to the concaves 116 and 118.

The fixed part 120 includes the operating part 150, a pair of recesses 162, a microphone 160, a speaker 170, an earphone terminal 172, and a battery part 174.

The fixed part 120 is made of a material similar to that of the movable part 110, and includes a front case and a rear case. The fixed part 120 may use the screws 148, like the movable part 110, and the screw cap 200 to hide the screws 148. However, this embodiment does not provide the fixed part 120 with the screw cap 200, because the appearance continuity of surfaces that have the display 148 and the operating part 150 (referred to as a "primary outer surface"), in particular, a surface that has the display 148, is generally more important for users than its back surface (also referred to as a "secondary outer surface"). Of course, the present invention does not prevent the fixed part 120 and the back surface of the movable part 110 shown in FIG. 1 from having the screw cap 200.

The operating part 150 exemplarily includes a trackball type operating part 152 and a ten-key operating part 154, and enters the communication information. The pair of recesses 162 receive the screw cap 200A when the movable part 110 is folded onto the fixed part 120. The microphone 160 is a portion through which a user inputs the voices. The speaker 170 outputs the incoming call sound. The terminal 172 is connectible to the earphone. The battery part 174 stores a battery. This embodiment arranges (upper) screws that combine the front case with the rear case of the fixed part 120 under the battery part 174, the battery part 174 hides the screws, and therefore no screw cap 200 is provided. The battery part 174 needs a predetermined thickness, and the fixed part 120 is necessarily thicker than the movable part 110. Since the fixed part 120 has a sufficient thickness, rubber hides, at a portion 176 shown in FIG. 2, (lower) screws that connect the front case to the rear case in the fixed part 120.

Use of the rubber is permitted since the rear surface is the secondary outer surface that does not have to maintain the appearance continuity. On the other hand, the rubber is inapplicable to the screw cap 200 due to the technical reason that the 1 mm-thick rubber is easily peeled off in addition to the appearance continuity reason. As discussed, the present invention does not prevent an application of the screw cap 200 to the portion 176. The member provided to the fixed part 120 may use any technologies known in the art, and a detailed description thereof will be omitted.

The hinge mechanism 130 rotatably connects the movable part 110 with the fixed part 120. The hinge mechanism 130 may use any technologies known in the art, and a detailed description thereof will be omitted.

The cellular phone 100 of this embodiment thus uses the screw caps 200 to hide the screws 148, and to maintains the appearance continuity of the movable part 110 at the side of the display 140, which attracts the user, when the movable part 110 is unfolded from the fixed part 120. Thereby, the user does not feel the conspicuousness of the screws 148. In particular, the screw cap 200 has the flat top surface 202 with no notch 16 or no perforation hole for removal unlike the prior art, and effectively maintains the appearance continuity of the housing, lessening the likelihood of the motives for disassembly and conversion of the housing.

Figure 6A:
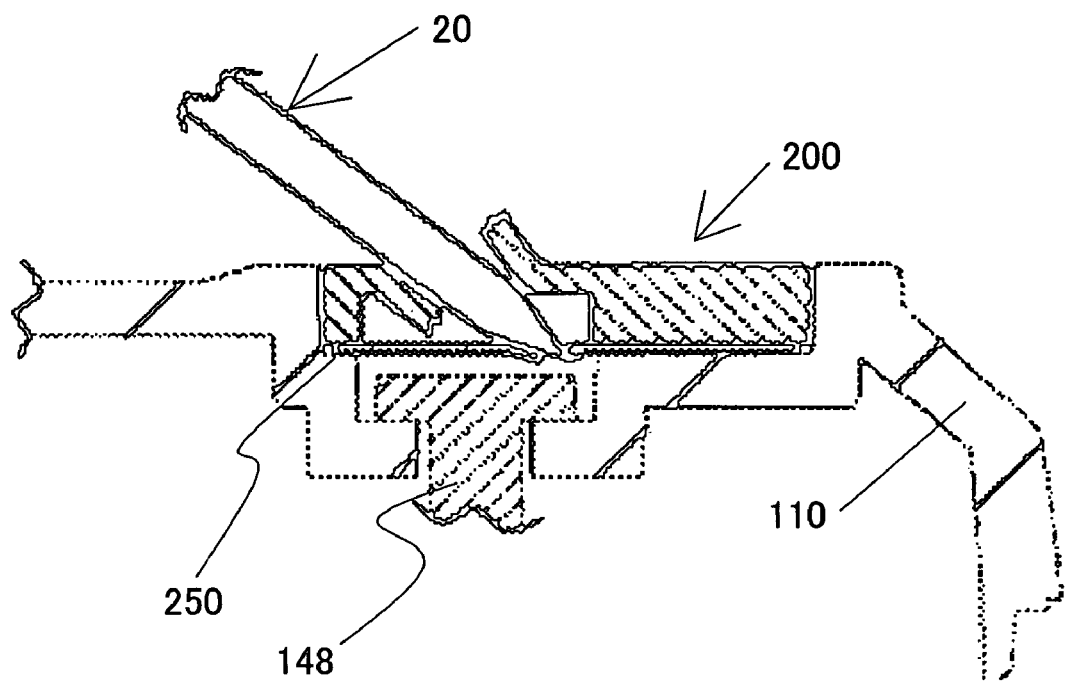
FIGS. 6A and 6B are sectional views for explaining a method for removing the screw cap shown in FIG. 1.
Figure 6B:
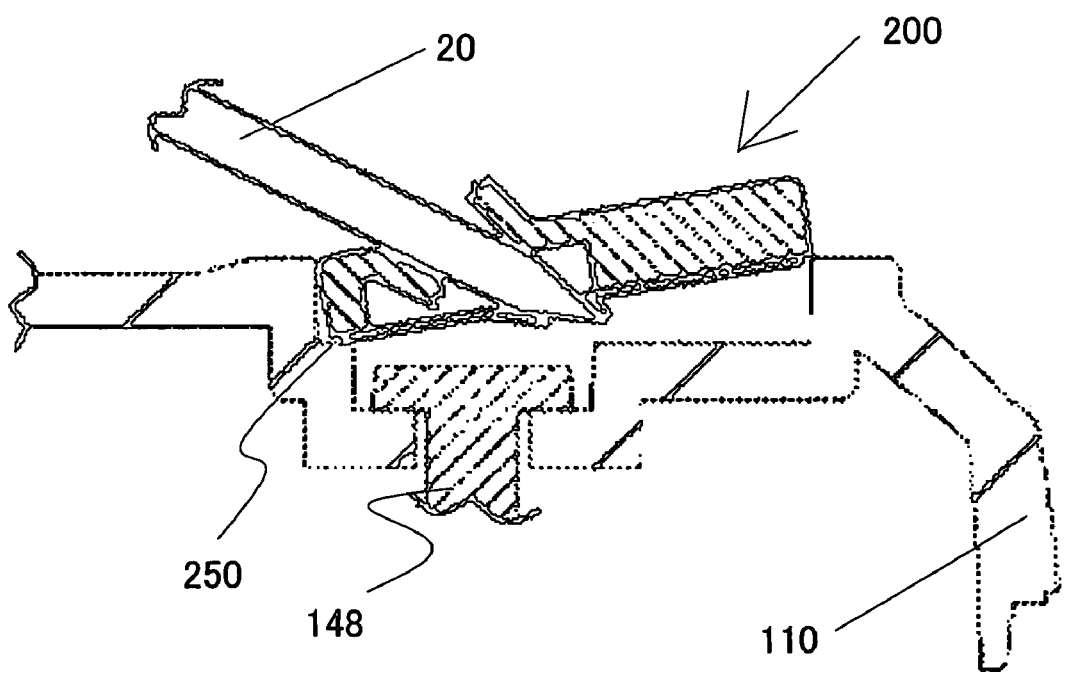
Figure 7C:
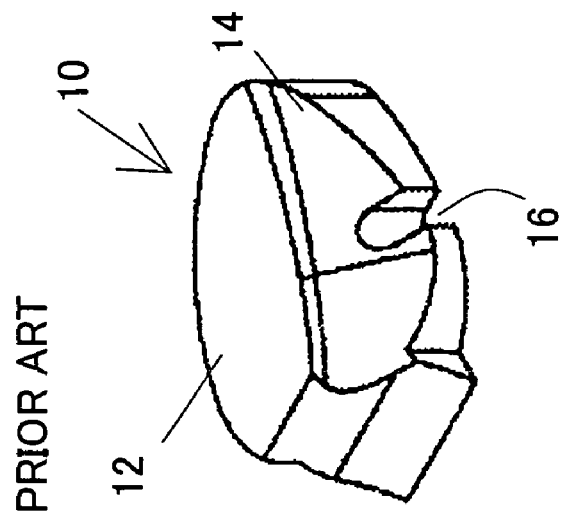
FIGS. 7A-7C are side and perspective views of a conventional screw cap.
Figure 7A:
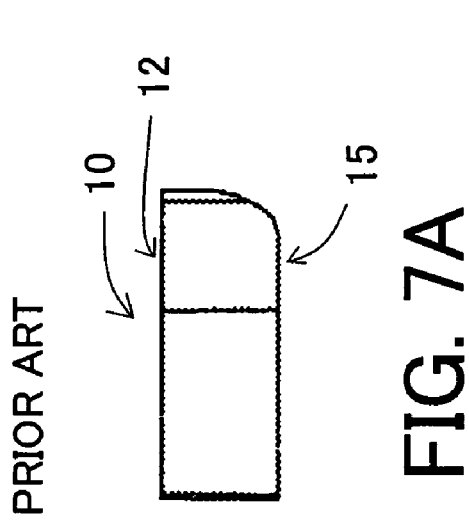
Figure 7B:
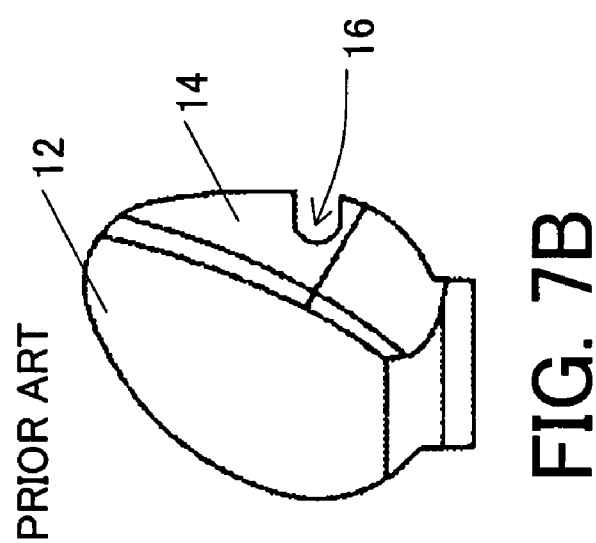
Figure 8:
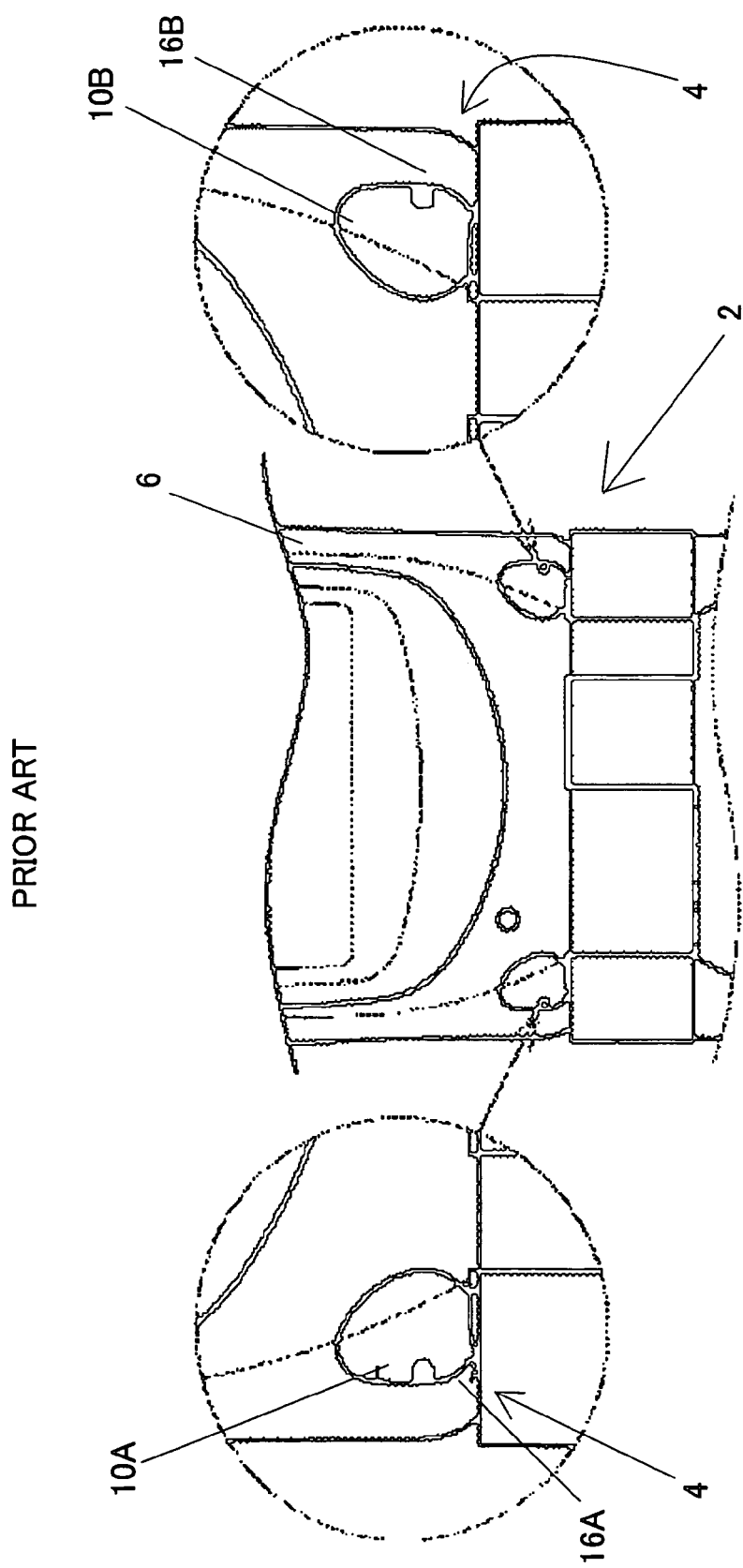
FIG. 8 is a partial plane view with a pair of partially enlarged screw caps in a conventional cellular phone.
Figure 9:
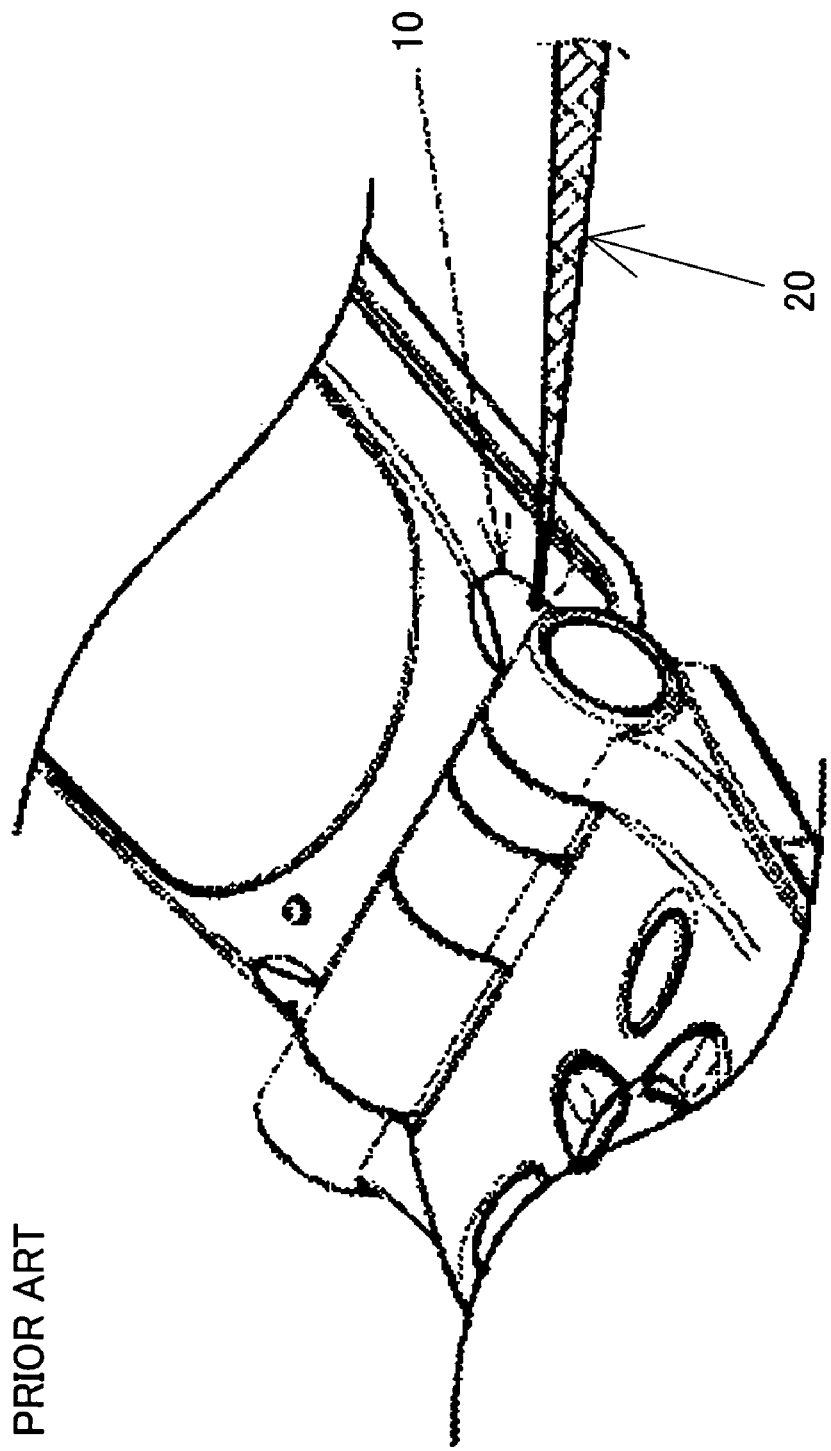
FIG. 9 is a perspective view for explaining a removal of the screw cap shown in FIG. 8.

Referring now to FIG. 6, a description will be given of a removal of the screw cap 200 from the cellular phone 100. Here, FIGS. 6A and 6B are sectional views for explaining the method for removing the screw cap 200. More specifically, FIG. 6A shows that the sharp tool 20 pierces through the screw cap 200, and FIG. 6B shows a removal of the screw cap 200 using the tool 20 by leverage subsequent to the state shown in FIG. 6A.

The screw cap 200 is removed by a manufacturer or a consignee (collectively referred to as an "authorized person" hereinafter) when the authorized person needs to disassemble the front case 112 from the rear case 114 of the housing for inspection, maintenance and replacement of an internal member.

In removing the screw cap 200, the tool 20, such as tweezers, is used similarly to the prior art. In using the tweezers, only one tip is used. As discussed above, when the screw cap 200 is viewed from the top, the veil of the thin-wall part 206 lessens the likelihood of the removal of the screw cap 200 for the disassembly and conversion. However, the authorized person previously knows the location of the thin-wall part 206, and pierces the tool 20 through the thin-wall part 206, as shown in FIG. 6A. The authorized person pierces the tool 20 until the tool 20 pierces the double-sided tape 250 (or until the tool 20 contacts the screw head of the screw 148 under the double-sided tape 250). As discussed above, since the thin-wall part 206 decenters from the screw cap 200, the piercing direction of the tool 20 is a direction from the center to the outside of the front case 112. Since the thin-wall part 206 is located in the screw cap 200, the front case 112 does not get damaged when the tool 20 pierces the thin-wall part 206.

Next, the authorized person lifts up the screw cap 200, as shown in FIG. 6B, by leverage, by slightly squeezing the tip of the tool 20 into a portion under the base 204 and lifting the base 204. At the left side of the screw cap 200 in FIG. 6B, the base 204 contacts the double-sided tape 205 in a small area and the adhesion is small. Therefore, the authorized person can remove the screw cap 200 from the housing simultaneous with the lifting action of the screw cap 200. The tool 20 may contact and scars the front case 112 under the base 204, but this scar is invisible after a new screw cap 200 is attached.

Thus, when the screw cap 200 is removed by leverage after the tool 20 pierces the thin-wall part 206, the tool 20 uses the perimeter of the perforation hole in the thin-walled part 206 as a fulcrum rather than the housing. Therefore, the housing gets no damages or needs no replacement as a result of the removal of the screw cap. In addition, the screw cap 20 can be removed more quickly than the prior art method that removes the screw cap 10 deliberately so as not to damage the housing.

The authorized person then removes the screws 148, disassembles the front case 112 from the rear case 114 for inspections, maintenance, and replacement of an internal part, and then fixes the front case 112 onto the rear case 114 using the screws 148. Thereafter, in the procedure similar to the above, a new screw cap 200 is attached to the housing via the double-sided tape 250.

Further, the present invention is not limited to these preferred embodiments, and a various variations and modifications may be made without departing from the spirit and scope of the present invention. For example, while the instant embodiment discusses the cellular phone as one example of the electronic apparatus, the present invention is applicable to various types of electronic apparatuses, such as a laptop PC, a PDA, a digital camera, and a game machine. In addition, unlike the screw cap 200 of the instant embodiment, the inventive shield does not necessarily maintain the appearance continuity of the housing. As long as the present invention can prevent damages of the housing during the removal of the screw cap 200, another modification may be made. For example, a perforation for removal may be provided inside the screw cap 200, not around the screw cap 200, so that the screw does not expose under the screw cap 200.

The present invention can provide a shield and an electronic apparatus having the same, which improve the economical efficiency of and maintainability of the electronic apparatus. The present invention is especially suitable for an environment that should maintain the appearance continuity of the housing of the electronic apparatus.

What is claimed is:

1. An electronic apparatus comprising:
   a housing made of a first material;
   a functional member that is provided in said housing, is made of a second material, and has a predetermined function; and
   a shield that is made of the first material and hides said functional member,
   wherein said shield has an invisible perforation part in said shield, the perforation part being to be perforated by an external member in removing said shield from said housing.

2. An electronic apparatus according to claim 1, wherein said shield has a sectionally concave shape at the perforation part, and is configured to be perforated at a concave of the perforation part.

3. An electronic apparatus according to claim 1, wherein said shield has a symmetrical shape.

4. An electronic apparatus according to claim 1, wherein said functional member is located under the perforation part.

5. An electronic apparatus according to claim 1, wherein the perforation part is located at a center of said shield.

6. An electronic apparatus according to claim 1, wherein said shield is made of resin, and a thickness of the perforation part is 0.6 mm or smaller.

7. An electronic apparatus according to claim 1, wherein said electronic apparatus is a mobile wireless communication apparatus, and said functional member is a screw used to fix said housing,
   wherein said electronic apparatus further comprises a display that displays communication information,
   wherein said housing includes:
   a first housing that has said display on a first surface; and
   a second housing that has an operating part used to input the communication information,
   wherein said first housing is connected rotatably to the second housing, and said shield is provided to the first housing on the first surface.

8. A shield used for an electronic apparatus that includes a housing made of a first material, and a functional member that is provided in said housing, is made of a second material, and has a predetermined function, said shield comprising the first material, and hiding said functional member,
   wherein the shield has an invisible perforation part in the shield, the perforation part being to be perforated by an external member in removing said shield from said housing.

* * * * *